United States Patent [19]

Markle

[11] Patent Number: 4,530,565

[45] Date of Patent: Jul. 23, 1985

[54] OPTICAL TRANSFORMER USING CURVED STRIP WAVEGUIDES TO ACHIEVE A NEARLY UNCHANGED F/NUMBER

[75] Inventor: David A. Markle, Norwalk, Conn.

[73] Assignee: The Perkin-Elmer Corporation, Norwalk, Conn.

[21] Appl. No.: 450,952

[22] Filed: Dec. 20, 1982

[51] Int. Cl.³ .......................... G02B 5/14; G02B 5/16
[52] U.S. Cl. .............................. 350/96.10; 350/96.12; 350/96.24; 350/96.25; 362/32
[58] Field of Search ............... 250/227; 350/96.10, 350/96.20, 96.22, 96.15, 96.12, 96.16, 96.24, 96.25, 96.27, 96.28; 362/32

[56] References Cited

U.S. PATENT DOCUMENTS

| | | | |
|---|---|---|---|
| 3,255,357 | 6/1966 | Kapany et al. | 250/227 |
| 3,489,482 | 1/1970 | Brill | 350/96.10 |
| 3,562,746 | 2/1971 | Aron | 350/96.10 |
| 3,800,058 | 3/1974 | Bartok et al. | 250/227 |
| 3,933,455 | 1/1976 | Chown | 350/96.22 |
| 4,151,582 | 4/1979 | Grunberger | 350/96.10 |
| 4,287,414 | 9/1981 | Soo et al. | 350/96.10 |

FOREIGN PATENT DOCUMENTS 1122369  1/1962  Fed. Rep. of Germany ... 350/96.10

Primary Examiner—William L. Sikes
Assistant Examiner—Brian M. Healy
Attorney, Agent, or Firm—Thomas P. Murphy; Edwin T. Grimes; Francis L. Masselle

[57] ABSTRACT

A transformer assembly particularly adapted, among other possible uses, for use in ring field illumination systems such as, for example, systems used in microlithography, said optical transformer assembly including an elongated member of glass or fused silica having a nearly circular or rectangular shape at one end for receiving a non-uniform input beam of light and through a gradual transitional intermediate section to an arcuate shape at the other end for outputting a uniformly illuminated arcuate shaped beam of light.

4 Claims, 9 Drawing Figures

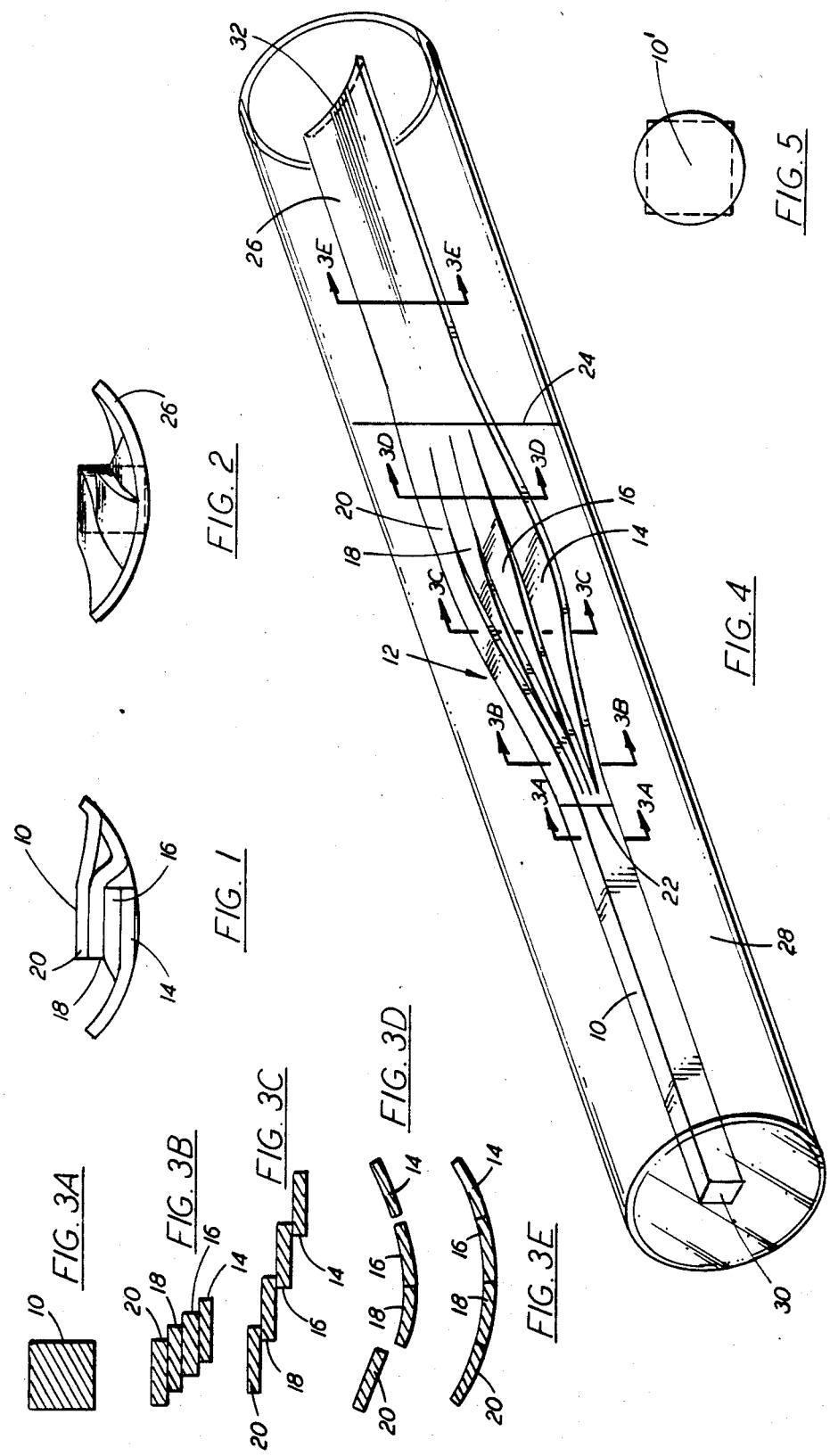

OPTICAL TRANSFORMER USING CURVED STRIP WAVEGUIDES TO ACHIEVE A NEARLY UNCHANGED F/NUMBER

FIELD OF THE INVENTION

This invention relates to condenser systems and more particularly to optical transformers for use in condenser systems. The optical transformers of the invention are particularly adapted, among other possible uses, for use in ring field illumination systems such as, for example, systems used in microlithography.

BACKGROUND OF THE INVENTION

Heretofore, ring field illumination systems used in microlithography used a curved mercury capillary lamp cooled with compressed air. While such systems have met with success, the system of the present invention is characterized by one or more of the following features: more efficient, brighter, less vibration, and constant light output rather than the time varying output characteristic of an alternating current source.

One of the main goals in the design of condenser systems is to achieve as high an intrinsic brightness in the image as possible with minimum electrical power input. In general, short arcs and capillary arcs have about equal electricity to light conversion factors, but the short arc has a much higher intrinsic brightness because all the power is radiated from a very small volume. By using an elliptical reflector as much as 80% of the light from a short arc can be imaged into a 3 mm. diameter spot. This invention permits the small unevenly illuminated image of the arc from a short arc lamp to be transformed into an evenly illuminated arcuate shaped source of illumination from which an efficient and uniform illumination system for a ring field projection system can be fashioned.

SUMMARY OF INVENTION

The foregoing and other advantages of the system of the invention, as compared to systems heretofore utilized for the above-stated purposes, will become apparent as the discussion proceeds.

Briefly, my invention contemplates the provision of an optical transformer assembly comprising an elongated member of glass or fused silica having a rectangular or circular shape at one end for receiving a non-uniform input beam of light which leads to a gradual transitional intermediate section and then to an arcuate shape at the other end for outputting a uniformly illuminated beam of light.

According to one feature of the invention the optical transformer is fabricated from a single monolithic piece of fused silica. According to another feature of the invention the first or input section comprises a relatively long rod of rectangular section or of circular section, which makes a gradual transition to rectangular section so that the cross-sectional area of the input section remains constant over its length. The intermediate section comprises a number of strips of glass fused together to form substantially a matching rectangle at the end attached to the rectangular rod and an arc comprising the full width of all the strips at the other end. The third piece or output end is in the form of a long curved strip with the same cross section as the end of the multiple strips and a smooth arcuate shape at the other end thereof. Further, the optical transformer is protected from dust by fusing the imput and output ends to windows at each end of a surrounding glass tube.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as the basis for the designing of other assemblies for carrying out the several purposes of the invention. It is important, therefore, that this disclosure be regarded as including such equivalent assemblies as do not depart from the spirit and scope of the invention.

Several embodiments of the invention have been chosen for purposes of illustration and description, and are shown in the accompanying drawings, forming a part of the specification.

BRIEF DESCRIPTION OF THE DRAWINGS

FIG. 1 is an input end view of an optical transformer assembly constructed according to the concepts of this invention;

FIG. 2 is an output end view of the transformer assembly of FIG. 1;

FIGS. 3a to 3e is a series of transverse sectional views of the second intermediate piece of the optical transformer assembly of FIG. 1;

FIG. 4 is a perspective view showing the transformer enclosed in an optical cylinder for mounting and protection; and FIG. 5 is an input end view of a second embodiment of an optical transformer assembly according to the invention.

DETAILED DESCRIPTION OF THE INVENTION

It will be appreciated that fused silica is such a good ultraviolet light transmitter that even if a foot length of it is used in an optical path, the absorption is less than 1%. In the embodiments of the invention illustrated, the optical transducer is formed of fused silica, or the like suitable material, which may be separate pieces joined together or a single piece pressing or machined piece with is arranged to transfer a small non-uniform nearly circular or rectangular image into a substantially uniform rectangular image, then into a moderately uniform nearly arcuate image, and finally into a very uniform nearly arcuate image, while wasting less than about 50% of the total light. Referring to FIGS. 1 and 4, the input section 10, is a simple rectangular rod of fused silica with a length to width ratio sufficient to output substantially uniform irradiance. As a result, after bouncing down the rod some distance, the irradiance becomes quite uniform. In another embodiment of the invention the first piece 10', FIG. 5, has a nearly circular input end and gradually over the length thereof changes to a rectangular configuration.

Referring to FIGS. 3 and 4, the transitional intermediate section 12, includes four strips, 14, 16, 18 and 20 of fused silica, or the like suitable material, fused together to form a rectangle at the end 22 attached to the rectangular rod 10 and an arc at the other end 24. Since the rod supplies substantially equal irradiance to each strip, the output from each strip has to be substantially equal. Furthermore, if the bends in the strips are made very gentle, the f/number will not be appreciably affected either by the rod or by the strips.

Referring to FIGS. 2 and 4, the output section 26, is an elongated curved strip fabricated from fused silica, or the like suitable material, with the same cross section as the end of the strips and having the desired arcuate shape at the output end thereof. This member also leaves the f/number unchanged since the cross section is constant, but like any other light pipe it improves the illumination uniformity. The longer the length, the better the uniformity.

Any dust on the glass surfaces would interfere with the total internal reflection and cause a loss of light and uniformity. This is minimized by sealing the whole assembly in a glass container or tube 28, FIG. 4. The ends 30 and 32 are fused to windows in the glass tube.

All of the pieces are, as near as possible, being perfectly smooth, wrinkle free, with parallel sides, in order to leave the f/number nearly unchanged. However, some increase in the light cone occurs, which is lost at the stop in the reimaging system, but this loss is tolerable.

The optical transformer assembly may be fabricated in any suitable manner such as, for example, by casting or pressing.

It will thus be seen that the present invention does indeed meet the objects specified hereinbefore.

Although certain particular embodiments of the invention are herein disclosed for purposes of explanation, various modifications thereof, after study of this specification, will be apparent to those skilled in the art to which the invention pertains, and reference should accordingly be had to the appended claims in determining the scope of the invention.

What is claimed is:

1. An optical transformer assembly comprising:
an input section of glass or fused silica having a rectangular shape, said section having an input end for receiving a non-uniform input beam of light, said section having a length to width ratio sufficient to output substantially uniform irradiance;
a transitional intermediate section having four strips of glass or fused silica, said strips being fused together to form a mating rectangular shape at the end attached to the output of said input section and an arcuate shape at the other end,
at a first transverse cross-section location of said intermediate section, said four strips being parallel with respect to each other with their ends disposed in stepped relationship, the side edges of each strip being fused to the side edge of the adjacent strip;
at a second transverse cross-section location of said intermediate section spaced from said first location toward the output of said intermediate section, said four strips being parallel with respect to each other with their ends disposed in stepped relationship, said steps being wider than the steps at said first cross-section location, the side edges of each strip being fused to the side edges of the adjacent strip;
at a third transverse cross-section location of said intermediate section spaced from said first and second locations toward the output of said intermediate section, the center two of said strips being fused in end to end relationship and the outside two of said strips being spaced from said center two strips;
an output section of glass or fused silica having a mating arcuate shape at the end attached to the output of said intermediate section, the output end of said output section having substantially the same arcuate shape as the input thereof, the length of said output section being sufficient to output substantially uniform irradiance; and
said optical transformer being fabricated from a single monolithic optical member which is substantially smooth, wrinkle free with parallel sides whereby the f/number from the input section to the output section is nearly unchanged.

2. An optical transformer assembly comprising:
an input section of glass or fused silica having a substantially circular shaped input and a substantially rectangular shaped output, said input end serving to receive a non-uniform input beam of light, said section having a length to width ratio sufficient to output substantially uniform irradiance;
a transitional intermediate section having four strips of glass or fused silica, said strips being fused together to form a mating rectangular shape at the end attached to the output of said input section and an arcuate shape at the other end;
at a first transverse cross-section location of said intermediate section, said four strips being parallel with respect to each other with their ends disposed in stepped relationship, the side edges of each strip being fused to the side edge of the adjacent strip;
at a second transverse cross-section location of said intermediate section spaced from said first location toward the output of said intermediate section, said four strips being parallel with respect to each other with their ends disposed in spaced relationship, said steps being wider than the steps at said first cross-section location, the side edges of each strip being fused to the side edges of the adjacent strip;
at a third transverse cross-section location of said intermediate section spaced from said first and second locations toward the output of said intermediate section, the center two of said strips being fused in end to end relationship and the outside two of said strips being spaced from said center two strips;
an output section of glass or fused silica having a mating arcuate shape at the end attached to the output of said intermediate section, the output end of said output section having substantially the same arcuate shape as the input thereof, the length of said output section being sufficient to output substantially uniformed irradiance; and
said optical transformer being fabricated from a single monolithic optical member which is substantially smooth, wrinkle free with parallel sides whereby the f/number from the input section to the output section is nearly unchanged.

3. An optical transformer assembly according to claim 1 further including a glass container for enclosing said optical transformer, the ends of said transformer being fused at the ends of said glass container.

4. An optical transformer assembly according to claim 2 further including a glass container for enclosing said optical transformer, the ends of said ransformer being fused to windows at the ends of said glass container.

* * * * *